(12) United States Patent
Nobayashi

(10) Patent No.: US 9,590,004 B2
(45) Date of Patent: Mar. 7, 2017

(54) SOLID-STATE IMAGING DEVICE AND IMAGING APPARATUS

(71) Applicant: CANON KABUSHIKI KAISHA, Tokyo (JP)

(72) Inventor: Kazuya Nobayashi, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/353,939

(22) PCT Filed: Nov. 29, 2012

(86) PCT No.: PCT/JP2012/081585
§ 371 (c)(1),
(2) Date: Apr. 24, 2014

(87) PCT Pub. No.: WO2013/094419
PCT Pub. Date: Jun. 27, 2013

(65) Prior Publication Data
US 2014/0306095 A1    Oct. 16, 2014

(30) Foreign Application Priority Data
Dec. 22, 2011  (JP) .................. 2011-282110

(51) Int. Cl.
*H01L 27/146* (2006.01)
*G02B 7/34* (2006.01)
(Continued)

(52) U.S. Cl.
CPC .......... *H01L 27/14625* (2013.01); *G02B 7/34* (2013.01); *H01L 27/1463* (2013.01);
(Continued)

(58) Field of Classification Search
CPC ......... H01L 27/14625; H01L 27/14627; H01L 27/14629; H01L 27/1463; G02B 7/34; H04N 5/2254; H04N 5/3696
See application file for complete search history.

(56) References Cited

U.S. PATENT DOCUMENTS 8,445,985 B2   5/2013  Hiyama et al.
8,817,162 B2   8/2014  Takagi
(Continued)

FOREIGN PATENT DOCUMENTS

CN    102208425    10/2011
JP    2002-314062  10/2002
(Continued)

OTHER PUBLICATIONS

Note: US 2013/0134536 is used as the English translation of WO2011-142065.*
(Continued)

*Primary Examiner* — Renee Chavez
(74) *Attorney, Agent, or Firm* — Fitzpatrick, Cella, Harper & Scinto

(57) ABSTRACT

A solid-state imaging device includes a plurality of pixels, wherein one or more of the plurality of pixels have a pupil dividing portion and a light receiving portion, the light receiving portion includes a plurality of photoelectric conversion regions, an element isolation region is provided between adjacent ones of the plurality of photoelectric conversion regions, and wherein a scatterer is provided within the pupil dividing portion and above the element isolation region, and the scatterer is formed from a material of a refractive index smaller than a refractive index of a material of the pupil dividing portion peripheral to the scatterer.

23 Claims, 12 Drawing Sheets

(51) Int. Cl.
   *H04N 5/225*  (2006.01)
   *H04N 5/369*  (2011.01)
(52) U.S. Cl.
   CPC .. *H01L 27/14627* (2013.01); *H01L 27/14629* (2013.01); *H04N 5/2254* (2013.01); *H04N 5/3696* (2013.01)

(56) References Cited

U.S. PATENT DOCUMENTS

| | | | |
|---|---|---|---|
| 9,287,423 B2 | 3/2016 | Mori | |
| 2006/0043261 A1* | 3/2006 | Matsuda | H01L 27/14636 250/208.1 |
| 2007/0275496 A1* | 11/2007 | Yamashita | H01L 27/14625 438/57 |
| 2011/0241148 A1* | 10/2011 | Hiyama | H01L 27/14623 257/435 |
| 2011/0249161 A1 | 10/2011 | Takagi | |
| 2013/0134536 A1* | 5/2013 | Mori | H01L 27/1462 257/432 |

FOREIGN PATENT DOCUMENTS

| | | |
|---|---|---|
| JP | 2003-069001 | 3/2003 |
| JP | 2003-69001 | 3/2003 |
| JP | 2009-158800 | 7/2009 |
| JP | 2010-213253 | 9/2010 |
| JP | 2011-222827 | 11/2011 |
| WO | 2011/142065 | 11/2011 |
| WO | 2011-142065 | 11/2011 |

OTHER PUBLICATIONS

German Office Action issued Aug. 9, 2016 during prosecution of related German application No. 112012005434.2, (Whole English-language translation included).

Chinese Office Action dated Nov. 10, 2016 issued in corresponding Chinese Application 201280062328.5 (whole English translation included).

* cited by examiner

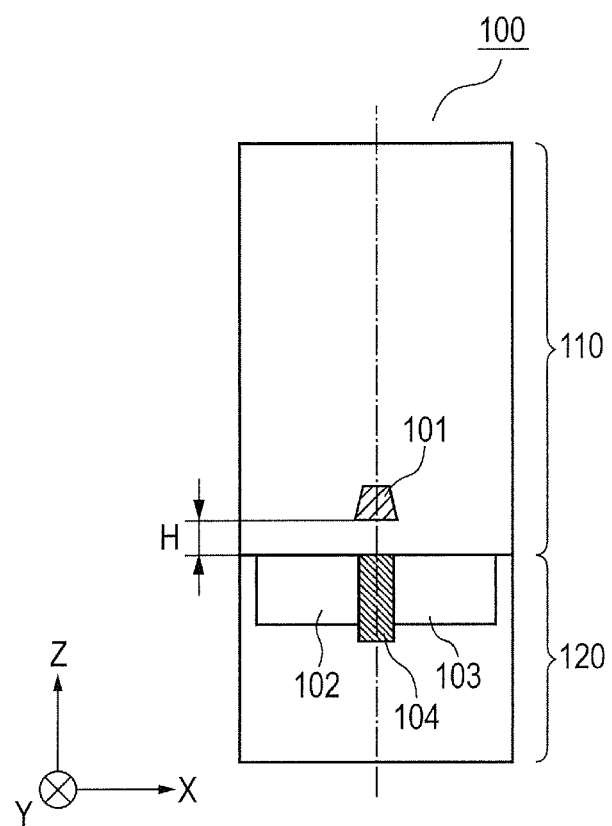

SOLID-STATE IMAGING DEVICE AND IMAGING APPARATUS

This application is a National Phase of PCT/JP2012/081585 filed Nov. 29, 2012, which in turn claims benefit of Japanese Application No. 2011-282110 filed Dec. 22, 2011.

TECHNICAL FIELD

The present invention relates to a solid-state imaging device and an imaging apparatus, and particularly relates to a solid-state imaging device which can be applied to a distance measuring apparatus that is used in a digital still camera, a digital video camera and the like.

BACKGROUND ART

In the digital still camera and the digital video camera, a solid-state imaging device has been proposed in Japanese Patent Application Laid-Open No. 2002-314062 (hereinafter referred to as "Patent Literature 1"), which has a pixel for measuring a distance having a distance measuring function (hereinafter referred to as a distance measuring pixel) arranged in a part of the imaging device or in all pixels, and detects the distance in a phase difference method. The distance measuring pixel includes a plurality of photoelectric conversion regions, and is structured so that light fluxes passed through different regions on the pupil of a camera lens are guided to different photoelectric conversion regions. Each distance measuring pixel acquires light images which are generated by the light fluxes passed through the different pupil regions, from signals obtained in the photoelectric conversion regions included in each distance measuring pixel (hereinafter referred to as an image A and an image B, and both images are collectively referred to as images AB). The phase difference method calculates the deviation amount between the images AB, convert the deviation amount to a defocused amount by using triangulation by a stereo image, and can measure the distance. Thereby, the phase difference method is different from that of a conventional contrast type, and does not need to move a lens in order to measure the distance. Accordingly, the imaging apparatus provided with the distance measuring pixel can measure the distance with a high speed and high accuracy. In addition, the signals which have been acquired in the plurality of the photoelectric conversion regions included in each distance measuring pixel can be used as pixel values of each distance measuring pixel, in order to generate a captured image. In such a distance measuring pixel, in order to suppress crosstalk between the photoelectric conversion regions, an element isolation region is arranged between the photoelectric conversion regions. However, a potential gradient is not formed in the element isolation region, and accordingly an electron which is generated by the light that is incident on the element isolation region diffuses and detection sensitivity in the photoelectric conversion region degrades. Because of this, the light which is incident on the element isolation region causes a loss, and the sensitivity degrades when the signal sent from the distance measuring pixel is used for the captured image, which is unpreferable for enhancing the image quality of the captured image.

CITATION LIST

Patent Literature

PTL 1: Japanese Patent Application Laid-Open No. 2002-314062

SUMMARY OF INVENTION

Technical Problem

In view of the above described problems, an object of the present invention is to provide a solid-state imaging device which can measure a distance with high accuracy and can suppress the degradation of sensitivity in imaging, and an imaging apparatus which is provided with the solid-state imaging device and can enhance the image quality.

According to an aspect of the present invention, a solid-state imaging device comprises a plurality of pixels, wherein one or more of the plurality of pixels have a pupil dividing portion and a light receiving portion, the light receiving portion includes a plurality of photoelectric conversion regions, an element isolation region is provided between adjacent ones of the plurality of photoelectric conversion regions, and wherein a scatterer is provided within the pupil dividing portion and above the element isolation region, and the scatterer is formed from a material of a refractive index smaller than a refractive index of a material of the portion the pupil dividing portion peripheral to the scatterer.

Advantageous Effects of Invention

The present invention can achieve a solid-state imaging device which can measure a distance with high accuracy and can suppress the degradation of sensitivity in imaging, and an imaging apparatus which is provided with the solid-state imaging device and can enhance the image quality.

Further features of the present invention will become apparent from the following description of exemplary embodiments with reference to the attached drawings.

BRIEF DESCRIPTION OF DRAWINGS

FIGS. 1A, 1B and 1C illustrate schematic sectional views of a pixel for measuring a distance arranged in a solid-state imaging device according to the present invention.

DESCRIPTION OF EMBODIMENTS

Figure 1A:
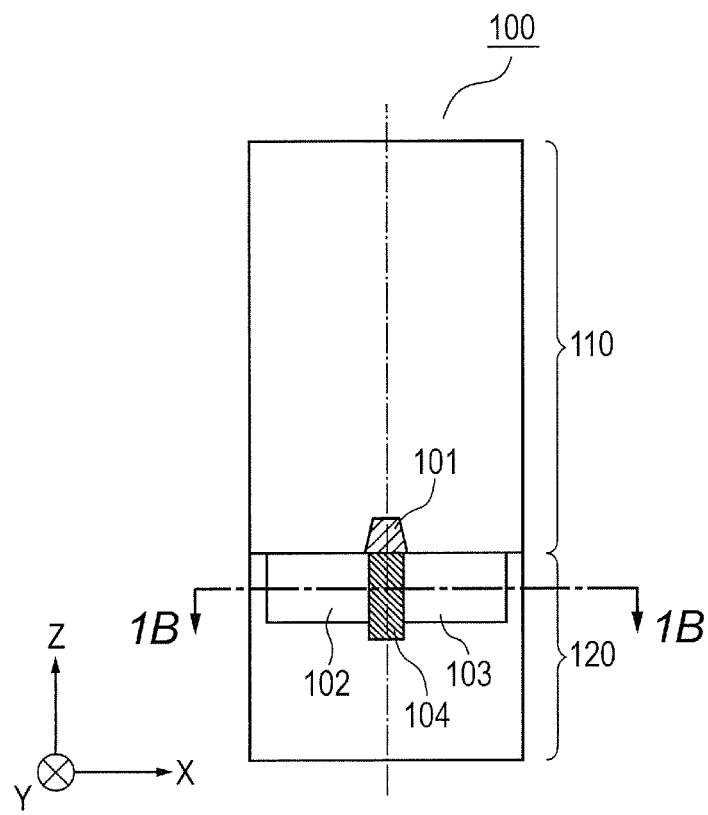

The solid-state imaging device according to an embodiment of the present invention will be described below with reference to the drawings. At this time, the components having the same functions as those in all of the drawings will be designated by the same reference numerals, and the description will be omitted.

Figure 1B:
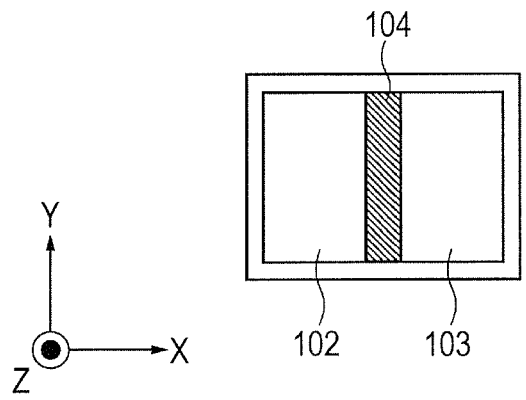

Firstly, the solid-state imaging device according to the present embodiment will be described below with reference to FIGS. 1A to 1C and FIG. 2. In FIGS. 1A to 1C, a distance measuring pixel 100 is arranged in a part of the solid-state imaging device of the present invention. FIG. 1A is a sectional view of the pixel 100 cut in an xz plane; and FIG. 1B is a sectional view of the pixel 100 taken along the line 1B-1B. The pixel 100 has a pupil dividing portion 110 and a light receiving portion 120, from the light incident side (+z side). The light receiving portion has a plurality of photoelectric conversion regions provided therein. For instance, the light receiving portion 120 has two photoelectric conversion regions 102 and 103, and an element isolation region 104 is provided between the photoelectric conversion region 102 and the photoelectric conversion region 103. The element isolation region 104 is formed from the same material as the material of the light receiving portion 120. A potential gradient is not formed in the element isolation region 104, and accordingly an electron which is generated by the light that is incident on the element isolation region 104 diffuses and the light causes a loss. In the distance measuring pixel 100 illustrated in FIG. 1A, a scatterer 101 is arranged so as to contact the end surface of −z side of the pupil dividing portion 110, which is a position in contact with the surface at the light receiving portion side of the pupil dividing portion, and so as to also be on the element isolation region 104.

The pupil dividing portion 110 has a structure including, for instance, a micro lens and a wave guide, and can optically divide the pupil by guiding light flux passed through different regions on the pupil of the imaging lens in the imaging apparatus into different photoelectric conversion regions (102 or photoelectric conversion region 103). The scatterer 101 and the pupil dividing portion 110 are formed from a transparent material in a region of wavelengths with which an image is taken. In addition, the scatterer 101 is formed from a material having a refractive index lower than that of a material of the pupil dividing portion 110 peripheral to the scatterer 101. Here, a material having a high refractive index can be selected from silicon nitride, titanium oxide, an organic material and a composite material which is formed by dispersing particles in a substrate. In addition, a material having a low refractive index can be selected from silicon oxide, an organic material and a composite material which is formed by dispersing particles in a substrate. The light receiving portion 120 is formed from a material having absorption in a region of wavelengths with which an image is taken, for instance, silicone, and has a photoelectric conversion region formed in a partial region in the inner part of the pixel by ion implantation or the like. The light flux which is incident on the pixel 100 from the outside propagates through the pupil dividing portion 110, and is emitted to the light receiving portion 120. At this time, a part of the light which propagates through the pupil dividing portion 110 is scattered by the scatterer 101 on the element isolation region. The light which has been emitted to the light receiving portion 120 reaches the photoelectric conversion region, then is converted into an electron, and is output to a not-shown signal processing circuit.

Figure 2:
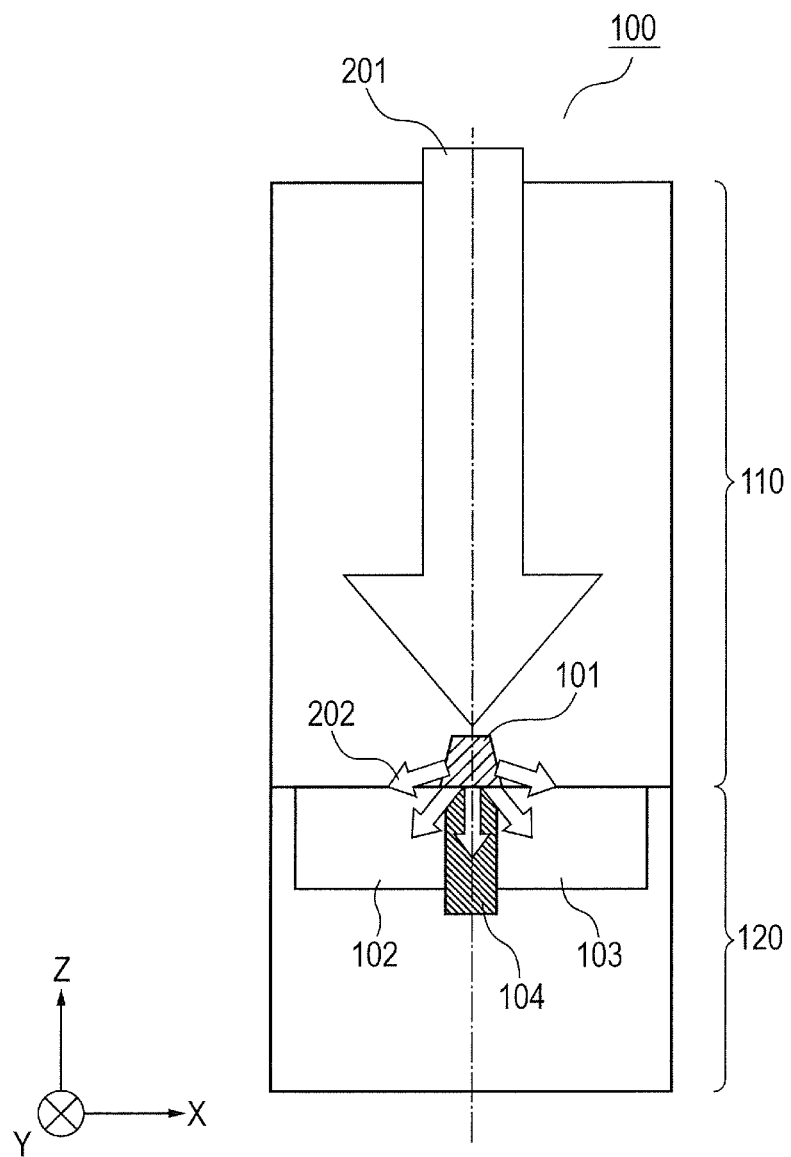
FIG. 2 is a view for describing the principle of the pixel for measuring the distance arranged in the solid-state imaging device according to the present invention.

FIG. 2 is a view for describing an optical propagation of a light flux in the pixel 100, which is incident from the outside. A part of the light flux 201 which is incident from the outside and heads to the element isolation region 104 is scattered by the scatterer 101 arranged in the pupil dividing portion 110, and becomes scattered light 202. The scattered light 202 has the orientation distribution of low directivity, and accordingly the light is distributed to the photoelectric conversion regions 102 and 103. As a result, the quantity of the light which is received in the photoelectric conversion regions 102 and 103 increases, and the pixel sensitivity becomes high. In the present embodiment, such materials are used that the refractive index of a material of the scatterer 101 (refractive index of scatterer 101) is lower than the refractive index of a material of the periphery of the scatterer 101 in an extent of the pupil dividing portion 110 (refractive index of pupil dividing portion 110 peripheral to the scatterer 101). When the refractive index of the scatterer 101 becomes higher than the refractive index of the pupil dividing portion 110 peripheral to the scatterer 101, a part of the light which propagates through the pupil dividing portion 110 is scattered by the scatterer 101, but an electric field converges to the inner part of the scatterer 101. The electric field which has converged to the inner part of the scatterer 101 is emitted from the lower surface (surface at −z side) of the scatterer 101, and accordingly the light which is emitted to the element isolation region 104 increases and the optical loss increases.

Figure 11:
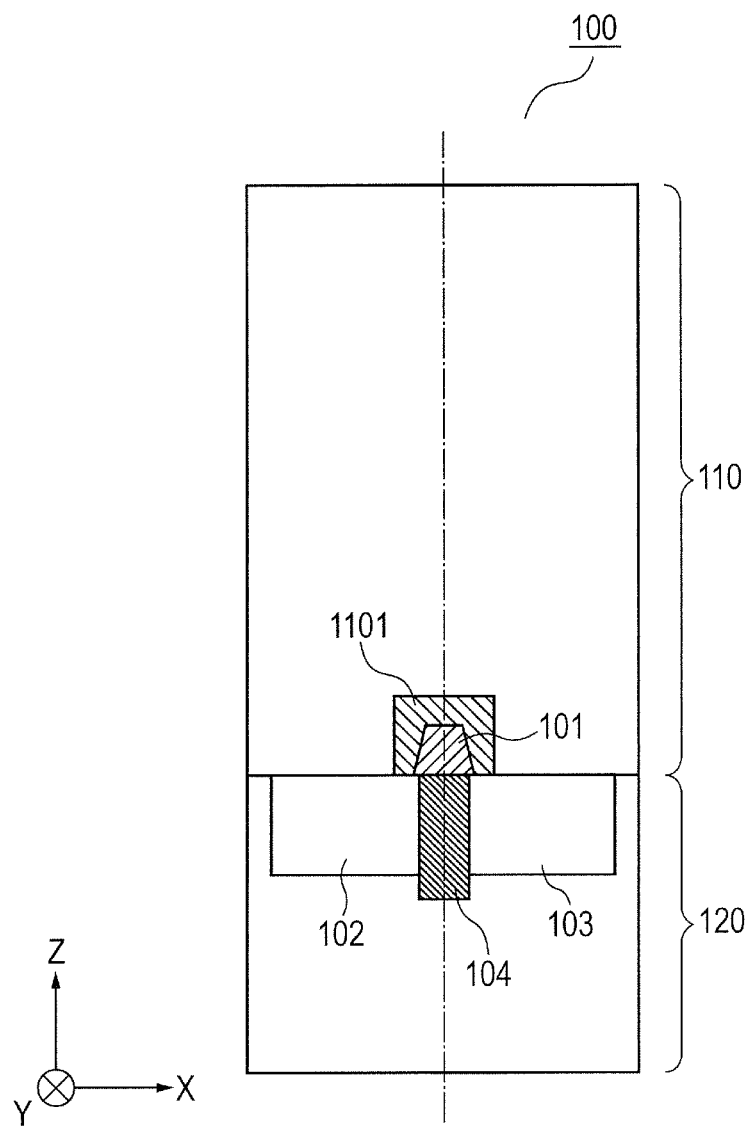
FIG. 11 is a schematic sectional view of a pixel for measuring a distance arranged in a solid-state imaging device, in an embodiment of the present invention.

On the other hand, the convergence of the electric field to the inner part of the scatterer 101 can be suppressed by reducing the refractive index of the scatterer 101 to become lower than the refractive index of the pupil dividing portion 110 peripheral to the scatterer 101, and the pupil dividing portion 110 can efficiently distribute the light to the photoelectric conversion region 102 and the photoelectric conversion region 103. As for the scatterer 101, when one medium 1 constitutes the pupil dividing portion 110, the refractive index of the material of the scatterer 101 becomes lower than the refractive index of the medium 1. In addition, when a plurality of media constitutes the pupil dividing portion 110, the refractive index of the material of the scatterer 101 becomes lower than the refractive index of the material of the periphery of the scatterer 101 in an extent of the pupil dividing portion 110. For instance, as is illustrated in a configuration example of the pixel 100 of FIG. 11, a high refractive index portion 1101 may be formed in a part of the pupil dividing portion 110, which is the periphery of the scatterer 101. In this case, the refractive index of the material of the scatterer 101 becomes lower than refractive index of the material of the high refractive index portion 1101. In the distance measuring pixel 100 illustrated in FIG. 1A, the scatterer 101 is arranged at a position contacting the end surface at a −z side of the pupil dividing portion 110, but may be arranged at a position at which the scatterer 101 can optically scatter a part of the light flux 201 which is incident from the outside and heads to the element isolation region 104. In other words, the scatterer 101 may be arranged above the element isolation region 104 in an extent of the pupil dividing portion 110. For instance, as is illustrated in FIG. 1C, the scatterer 101 may also be arranged above the element isolation region 104 and at such a position (in an extent of the pupil dividing portion 110) as to be apart from the end surface at the −z side of the pupil dividing portion 110 by a distance H. In this case as well, the pupil dividing portion 110 can optically scatter a part of the light flux 201 which is incident from the outside and heads to the element isolation region 104 by the scatterer 101, and can distribute the light to the photoelectric conversion regions 102 and 103. As a result, the pixel sensitivity in the pixel 100 can be enhanced.

Figure 3A:
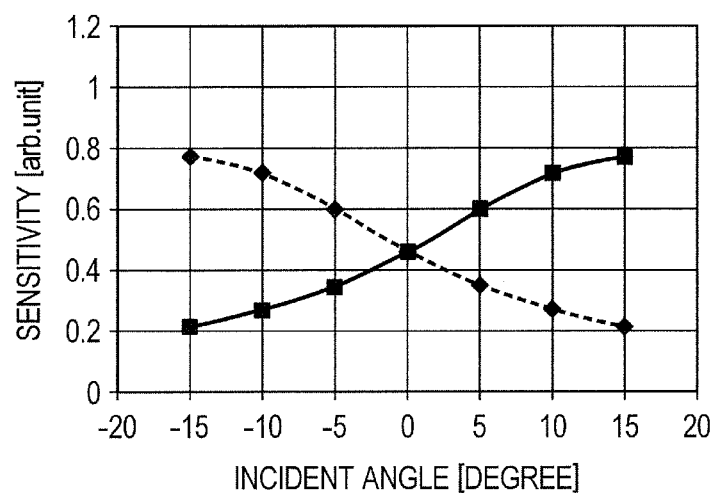
FIGS. 3A and 3B illustrate views for describing a method for measuring a distance from an object to be imaged by using the solid-state imaging device according to the present invention.

Next, a distance measuring method for measuring a distance of an object to be imaged by using the solid-state imaging device of the present invention will be described below with reference to FIGS. 3A and 3B. FIG. 3A illustrates the sensitivity of the photoelectric conversion region 102 and the sensitivity of the photoelectric conversion region 103 in the pixel 100 which is arranged in the solid-state imaging device of the present invention. In FIG. 3A, the horizontal axis represents an angle formed by the light flux which is incident from the outside of the pixel 100 and the optical axis, and the vertical axis represents the sensitivity. In FIG. 3A, the sensitivity of the photoelectric conversion region 102 is shown by a solid line, and the sensitivity of the photoelectric conversion region 103 is shown by a dashed line. As is illustrated in FIG. 3A, the photoelectric conversion region 102 and the photoelectric conversion region 103 have different sensitivity according to the angle of the light which is incident from the outside.

Figure 3B:
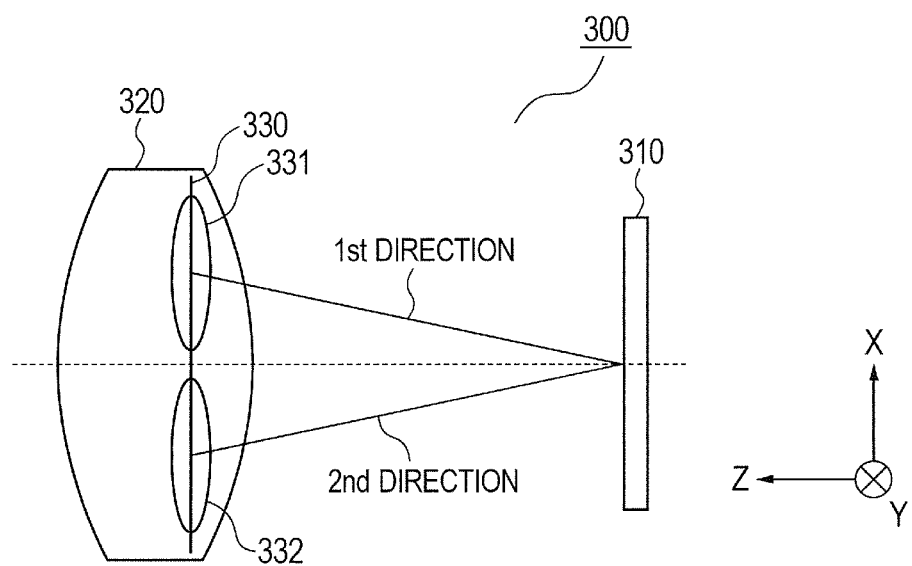

FIG. 3B is a schematic view of a digital still camera 300. An imaging lens 320 in the digital still camera 300 forms an image of the outside on the surface of the solid-state imaging device 310. The solid-state imaging device 310 includes a plurality of pixels 100. The light fluxes passed through different regions on an emission pupil 330 of the imaging lens 320 are incident on the surface of the solid-state imaging device 310, as the light fluxes having different incident angles. In the photoelectric conversion region 102 contained in each pixel of the solid-state imaging device 310, a light flux is detected which has passed mainly through a region 331 corresponding to the first direction (first emission pupil region) out of the emission pupil 330. Similarly, in the photoelectric conversion region 103, the light flux is detected which has mainly passed through a region 332 corresponding to the second direction (second emission pupil region) out of the emission pupil 330. For this reason, the pixel 100 can detect an image of lights passed through the different regions on the surface of the emission pupil 330. The solid-state imaging device 310 compares a plurality of pixel signals sent from the photoelectric conversion regions 102 with a plurality of pixel signals sent from the photoelectric conversion regions 103, thereby outputs a distance measuring signal for an object to be imaged according to a known method, and can detect the distance from the object to be imaged. The solid-state imaging device 310 may also be structured so that the pixel 100 is arranged only in a part of the pixels in the solid-state imaging device 310 and each of the remaining pixels has only one photoelectric conversion region. The pixel 100 is desirably arranged in all pixels, and thereby the distance from the object to be imaged can be detected with higher accuracy.

EXEMPLARY EMBODIMENTS

Exemplary embodiments according to the present invention will be described below.

Exemplary Embodiment 1

Figure 4A:
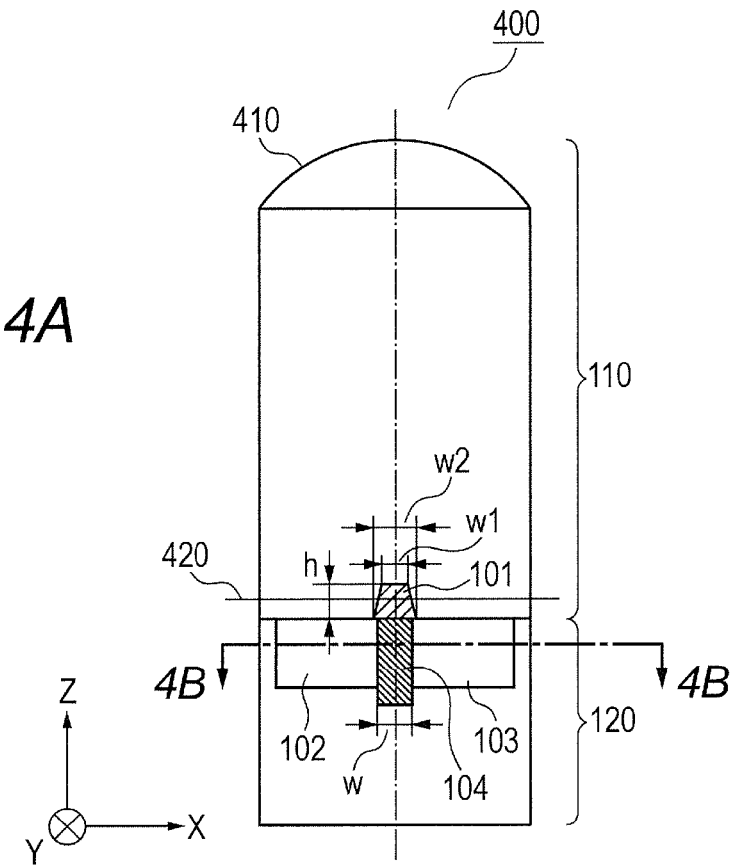
FIGS. 4A, 4B and 4C illustrate schematic sectional views of a pixel for measuring a distance arranged in a solid-state imaging device in Exemplary Embodiment 1 of the present invention.
Figure 4B:
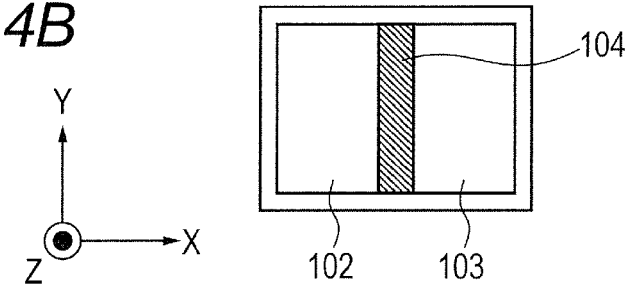
Figure 4C:
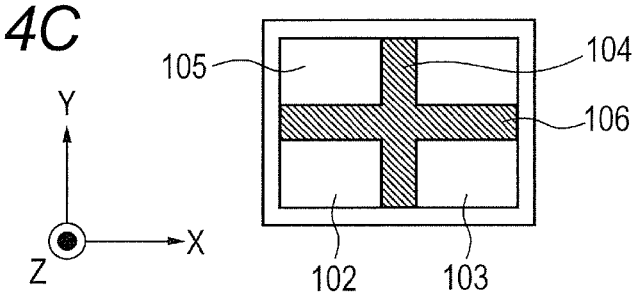

As Exemplary Embodiment 1, the configuration example of the solid-state imaging device of the present invention will be described below with reference to FIGS. 4A to 4C. In FIGS. 4A to 4C, a distance measuring pixel 400 is arranged in a part of the solid-state imaging device of the present exemplary embodiment. FIG. 4A is a sectional view of the pixel 400 cut in an xz plane; and FIG. 4B is a sectional view of the pixel 400 taken along the line 4B-4B. The light receiving portion 120 in the pixel 400 of the present exemplary embodiment has two photoelectric conversion regions (102 and 103), and the element isolation region 104 is arranged between the photoelectric conversion region 102 and the photoelectric conversion region 103. In the present exemplary embodiment, a pupil dividing portion 110 has a structure which includes a micro lens 410 and a not-shown color filter. In the present exemplary embodiment, a paraxial imaging plane 420 of the micro lens 410 is set at a position 0.3 μm apart from the surface at a +z side of the light receiving portion 120, in +z direction.

The pixel 400 of the present exemplary embodiment has the micro lens 410 arranged therein, and thereby efficiently guides a light flux which is incident from the outside to the light receiving portion 120, and sets the pupil of an imaging lens and the photoelectric conversion region at a conjugation relationship. Thereby, a region 331 and a region 332 which are different regions from each other on the pupil can be more clearly separated from each other. The micro lens 410 is formed from a transparent material in a region of wavelengths with which an image is taken, and is formed, for instance, from silicon nitride, silicon oxide, an organic material or the like. In the present exemplary embodiment, the scatterer 101 is formed from silicon oxide which is a material having a low refractive index, and the pupil dividing portion 110 was formed from silicon nitride which is a material having a high refractive index. In addition, the light receiving portion 120 was formed from silicon. Generally, the refractive index of the silicon oxide is approximately 1.45, and the refractive index of the silicon nitride is approximately 2.0. In the present exemplary embodiment, the refractive index of the material of the scatterer 101 is set so as to be lower than the refractive index of a material of the periphery of the scatterer 101 in an extent of the pupil dividing portion 110. Thereby, the pupil dividing portion 110 can suppress the convergence of the electric field to the inner part of the scatterer 101, and can distribute the light to the photoelectric conversion region 102 and the photoelectric conversion region 103. The shapes of the scatterer 101 and the element isolation region 104 are formed so that w1=0.1 μm, w2=0.2 μm, h=0.4 μm, and w=0.2 μm. Incidentally, as is illustrated in FIGS. 4A to 4C, w1 represents the width of the upper surface of the scatterer 101, w2 represents the width of the lower surface of the scatterer 101, h represents the height of the scatterer 101, and w represents the width of the element isolation region 104. The widths of the photoelectric conversion regions 102 and 103 are 0.55 μm.

Figure 5A:
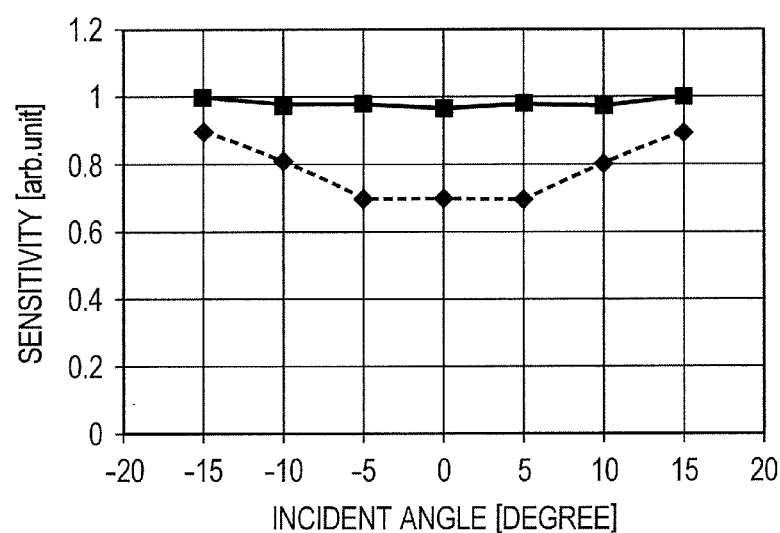
FIGS. 5A and 5B illustrate views illustrating the dependency of the sensitivity of the pixel for measuring the distance in Exemplary Embodiment 1 of the present invention and a comparison pixel, on an incident angle.
Figure 5B:
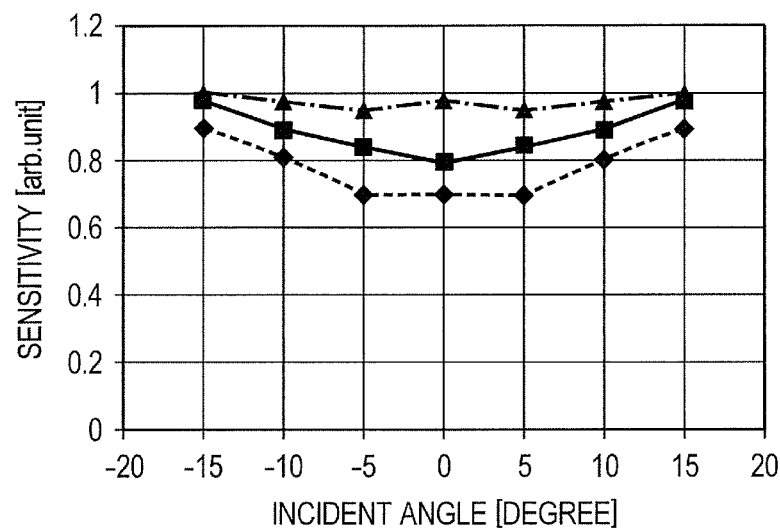

FIG. 5A illustrates the sum of the respective sensitivities of the photoelectric conversion regions 102 and 103 in the pixel 400 of the present exemplary embodiment. In FIG. 5A, the horizontal axis represents an angle formed by the light which is incident from the outside on the pixel and the z axis, and the vertical axis represents the sensitivity. In addition, the pixel 400 is shown by a solid line, and a comparison pixel in which the scatterer 101 is not arranged is shown by a dashed line as a comparative example. In the pixel 400, the scatterer 101 is arranged, and thereby the pixel sensitivity is enhanced compared to that of the comparison pixel. In the present exemplary embodiment, the scatterer 101 is formed so that the shape of the cross section in the xz plane becomes a trapezoid shape, but may also have a quadrangle shape or a triangle shape, as long as the scatterer 101 scatters a part of the light flux which is incident from the outside, and has the refractive index lower than that of a material of the pupil dividing portion 110. It is desirable to set the surface area of the upper surface (surface at +z side) of the scatterer 101 so as to be smaller than the surface area of the lower surface (surface at −z side) thereof. Thereby, the scatterer 101 can increase the forward scattering therefrom compared to the back scattering therefrom, and can increase the quantity of the lights which are incident on the photoelectric conversion region 102 and the photoelectric conversion region 103. In addition, the scatterer 101 may have a composition of dispersing fine particles or voids in a medium. The scatterer 101 can enhance the light scattering properties by dispersing the fine particles or the voids in the medium. In addition, the widths w1 and w2 of the scatterer 101 may be shorter or longer than the length shown in the present exemplary embodiment. FIG. 5B illustrates the sensitivity of the pixel 400, similarly to FIG. 5A. In FIG. 5B, a solid line shows the case (w1=0.2 µm and w2=0.3 µm) in which the widths w1 and w2 are 0.1 µm longer than that of the scatterer 101 in FIG. 5A, a long dashed short dashed line shows the case (w1=0 µm and w2=0.1 µm) in which the widths w1 and w2 are 0.1 µm shorter than that of the scatterer 101 in FIG. 5A, and a dashed line shows a comparison pixel in which the scatterer 101 is not arranged. As is illustrated in FIG. 5B, the width of the scatterer 101 may be longer or shorter than that of the element isolation region, as long as a part of the incident light flux is scattered by the scatterer 101.

In the present exemplary embodiment, such a structure has been shown that the pixel 400 includes two photoelectric conversion regions, but the pixel 400 may include four photoelectric conversion regions (102, 103, 105 and 106) in the light receiving portion 120 as is illustrated in the sectional view of the pixel 400 taken along the line 4B-4B in FIG. 4A. When the four photoelectric conversion regions are arranged in the light receiving portion 120, the pixel 400 can detect a distance from an object to be imaged which includes not only an object to be imaged having an end in a direction parallel to the y axis but also an object to be imaged having an end in a direction parallel to the x axis, with high accuracy. In the present exemplary embodiment, the height of the scatterer 101 has been set at 0.4 µm, but may be higher or lower than 0.4 µm, as long as the light is scattered by the scatterer 101. It is desirable to arrange the end at the micro lens 410 side of the scatterer 101 at a side closer to the micro lens 410 than the paraxial imaging plane of the micro lens 410. Furthermore, the height of the scatterer 101 is set at 1 µm or less, and thereby such a distance measuring pixel can be structured as to be capable of measuring a distance from an object to be imaged with higher accuracy while reducing the optical loss caused by the element isolation region 104. This reason will be described below.

Figure 6A:
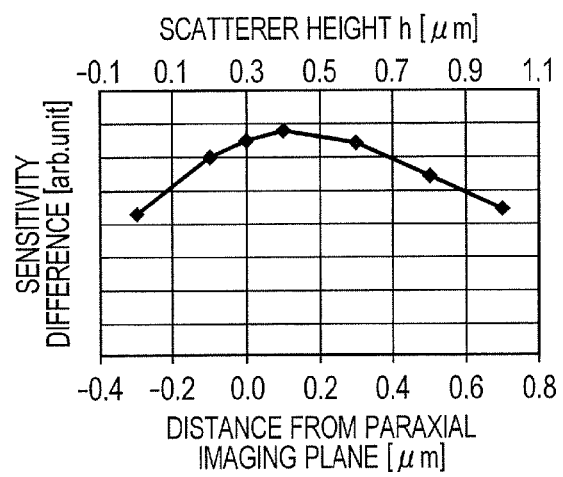
FIGS. 6A, 6B and 6C illustrate views illustrating the sensitivity difference of the pixel for measuring the distance and the dependency of the sensitivity difference on the end position of a scatterer, in Exemplary Embodiment 1 of the present invention.
Figure 6B:
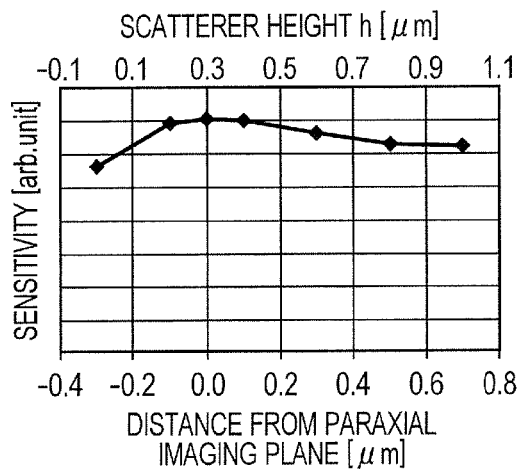
Figure 6C:
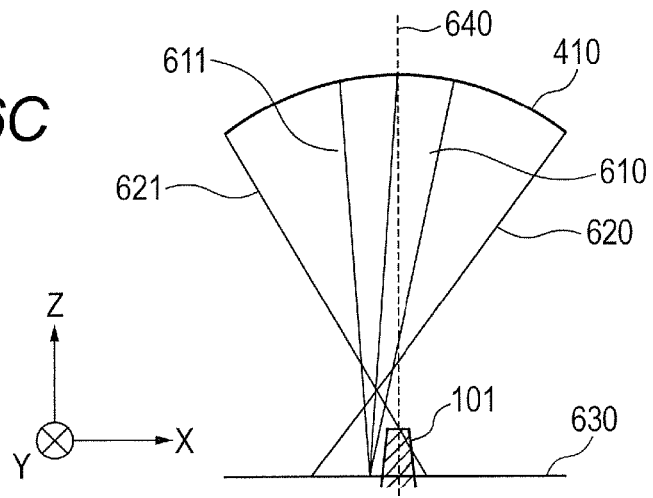

In FIG. 6A, the horizontal axis represents a distance (lower axis) between the paraxial imaging plane of the micro lens 410 and the end portion at the +z side of the scatterer 101, and the height h (upper axis) of the scatterer 101; and the vertical axis represents a difference (sensitivity difference) between the sensitivity of the photoelectric conversion region 102 when the incident angle is 5 degrees and the sensitivity thereof when the incident angle is −5 degrees. As this sensitivity difference is larger, a region on the surface of the emission pupil can be more clearly divided, and accordingly the distance from the object to be imaged can be detected with higher accuracy. In FIG. 6B, the horizontal axis represents a distance (lower axis) between the paraxial imaging plane of the micro lens 410 and the end portion at the +z side of the scatterer 101, and the height h (upper axis) of the scatterer 101; and the vertical axis represents the sum of the sensitivities of the photoelectric conversion region 102 and the photoelectric conversion region 103. As is illustrated in FIG. 6B, the pixel 400 can enhance its sensitivity by arranging the scatterer 101 therein. FIG. 6C is a view for describing the light flux after having passed through the micro lens 410. An optical axis 640, a paraxial imaging plane 630 of the micro lens 410, rays 610 and 611 of light in the central part of the micro lens 410, and rays 620 and 621 of light in the peripheral part of the micro lens 410 are shown. The micro lens 410 is structured so as to have a spherical surface, and accordingly has an aberration. Because of this, the rays 620 and 621 of light, passed through the peripheral part of the micro lens 410, condense at a position closer to the +z side than the paraxial imaging plane 630. When the end portion at the +z side of the scatterer 101 is arranged at a position closer to the +z side than the paraxial imaging plane 630, the peripheral ray 621 of light can be scattered and the quantity of the light which is incident on the +x side can be decreased. In other words, a difference of the light quantity can be increased. Accordingly, it is desirable that the end portion at the light incident side of the scatterer is arranged at a position closer to the light incident side than the paraxial imaging plane of the micro lens, in other words, that the end portion at the +z side of the scatterer 101 is arranged at a position closer to the +z side than the paraxial imaging plane of the micro lens 410.

Figure 12A:
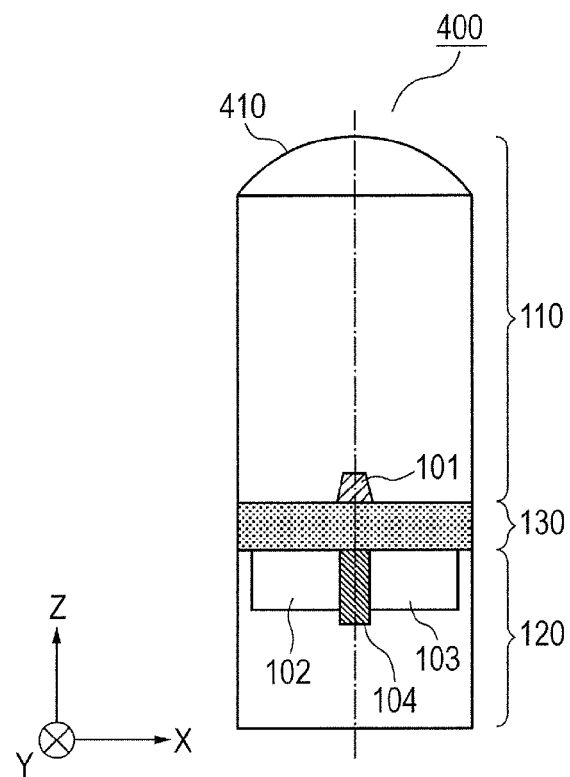
FIGS. 12A and 12B illustrate schematic sectional views illustrating another example of a pixel for measuring a distance arranged in a solid-state imaging device according to the present invention.

As is illustrated in FIG. 6A, when the height h of the scatterer 101 becomes high, the sensitivity difference in the vicinity of h=1 µm becomes approximately equal to that in the case where the scatterer 101 is not arranged (in the case of h=0). In order to increase the sensitivity difference, the peripheral ray 620 of light is required to be guided to the −x side, but when the scatterer 101 is made high, the peripheral ray 620 of light is scattered, and the light is distributed also to the +x side. Specifically, the sensitivity difference decreases. Accordingly, in order to reduce the optical loss caused by the element isolation region 104 and increase the sensitivity difference, it is desirable to set the height of the scatterer 101 at 1.0 µm or less. It is more desirable to set the height h of the scatterer 101 at 0.6 µm or less while arranging the end portion at the +z side of the scatterer 101 at a position closer to the +z side than the paraxial imaging plane of the micro lens 410. Incidentally, the pixel 400 of the present exemplary embodiment includes the pupil dividing portion 110 and the light receiving portion 120, but as is illustrated in FIG. 12A, an interlayer 130 may be arranged between the light receiving portion 120 and the pupil dividing portion 110. Even when the interlayer 130 is arranged therebetween, the pupil dividing portion 110 can optically scatter the light flux which is incident from the outside and heads to the element isolation region 104 by the scatterer 101, and can distribute the light to the photoelectric conversion regions 102 and 103. As a result, the interlayer 130 can enhance the pixel sensitivity of the pixel 400. The interlayer 130 may also be formed so as to function as an anti-reflection film in a region of wavelengths with which the solid-state imaging device provided with the pixel 400 takes an image, by being formed from a plurality of films. When functioning as the antireflection film, the interlayer 130 can more efficiently guide the light flux which is incident from the outside to the light receiving portion 120, and can enhance the pixel sensitivity of the pixel 400. In addition, the interlayer 130 may also have a function of a protection film for protecting the light receiving portion 120 in a semiconductor process such as etching, or a function of a gettering film for lowering the concentration of metal impurities in the light receiving portion 120, by appropriately selecting a material of the interlayer 130.

Exemplary Embodiment 2

Figure 7:
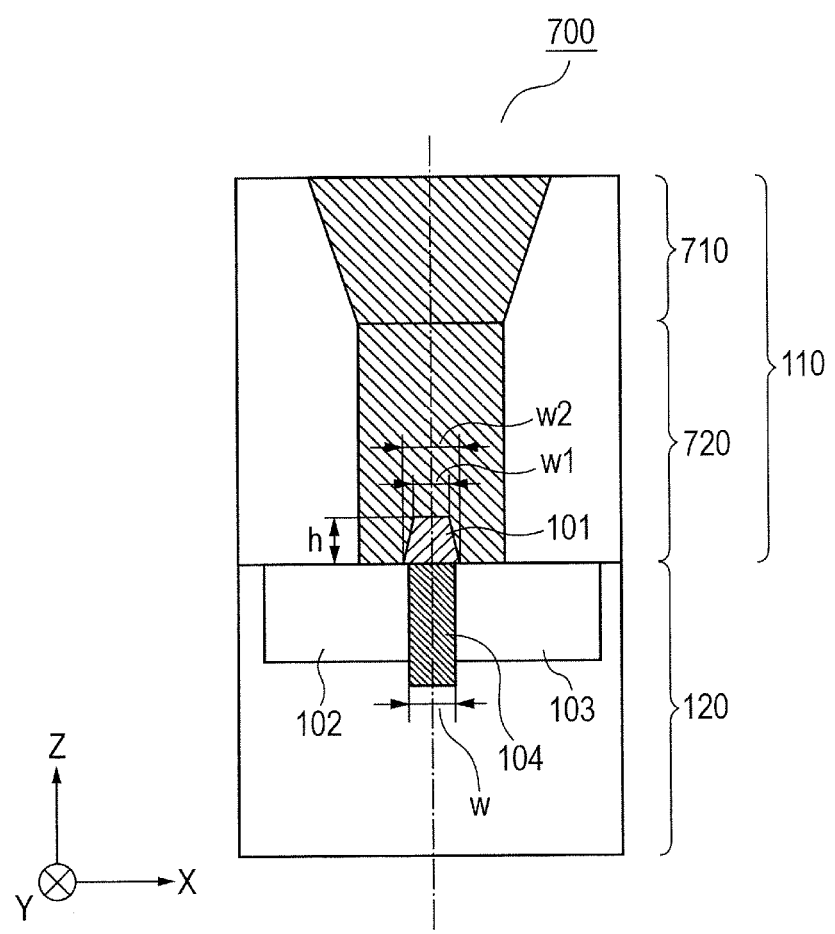
FIG. 7 is a schematic sectional view of a pixel for measuring a distance arranged in a solid-state imaging device in Exemplary Embodiment 2 of the present invention.

As Exemplary Embodiment 2, the configuration example of the solid-state imaging device of the present invention will be described below with reference to FIG. 7. In FIG. 7, a distance measuring pixel 700 is arranged in a part of the solid-state imaging device of the present exemplary embodiment. FIG. 7 is a sectional view of the pixel 700 cut in an xz plane. In the present exemplary embodiment, a pupil dividing portion 110 includes a light incident side wave guide portion 710, and an emission side wave guide portion 720. In the pixel 700 of the present exemplary embodiment, the pupil dividing portion 110 is formed of a wave guide, and thereby can efficiently guide the light flux which is incident from the outside to the light receiving portion 120. The cores and the claddings of the light incident side wave guide 710 and the emission side wave guide 720 are formed from a transparent material in a region of wavelengths with which an image is taken, and furthermore, the core is formed from a material having a refractive index higher than that of the cladding. The scatterer 101 is formed from a material having a refractive index lower than that of the core of the emission side wave guide 720. Usable materials having a high refractive index include silicon nitride, titanium oxide, an organic material and a composite material which is formed by dispersing particles in a substrate, for instance. In addition, usable materials having a low refractive index include silicon oxide, an organic material and a composite material which is formed by dispersing particles in a substrate, for instance.

In the present exemplary embodiment, the cores of the light incident side wave guide 710 and the emission side wave guide 720 were formed from silicon nitride, the claddings thereof were formed from silicon oxide, and the scatterer 101 was formed from silicon oxide. When the components are formed in this way, the refractive index of the material of the scatterer 101 can be set to be lower than that of the material of the core of the emission side wave guide 720. In addition, the pupil dividing portion 110 suppresses the convergence of the electric field to the inner part of the scatterer 101, and thereby can efficiently distribute the light to the photoelectric conversion region 102 and the photoelectric conversion region 103. The shapes of the scatterer 101 and the element isolation region 104 have the following sizes: w1=0.1 µm, w2=0.2 µm, h=0.6 µm, and w=0.2 µm. Incidentally, the lengths represented by w1, w2, h and w are similar to those in FIGS. 4A to 4C. The widths of the photoelectric conversion regions 102 and 103 are 0.55 µm.

Figure 8:
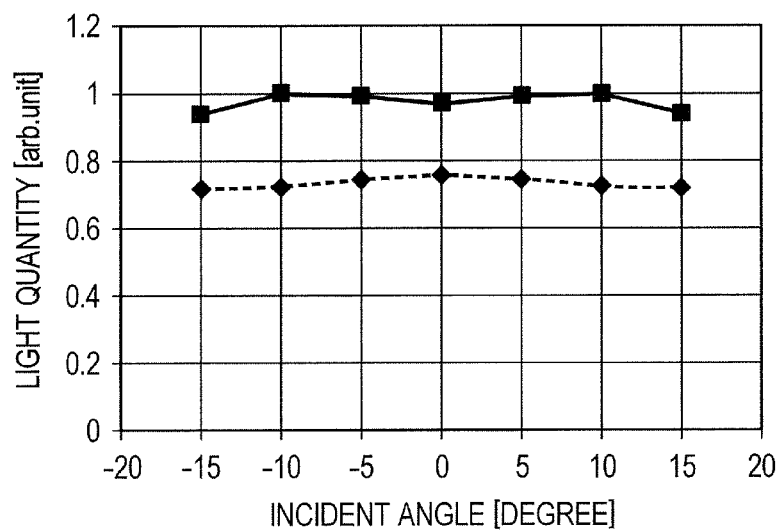
FIG. 8 is a view illustrating the dependency of the sensitivity of the pixel for measuring the distance in Exemplary Embodiment 2 of the present invention and a comparison pixel, on an incident angle.

FIG. 8 illustrates the quantity of light which is received by the photoelectric conversion regions 102 and 103 in the pixel 700 of the present exemplary embodiment. The horizontal axis and the vertical axis of FIG. 8 represent similar factors to those of FIG. 5A. In FIG. 8, the pixel 700 of the present exemplary embodiment is shown by a solid line, and a comparison pixel in which the scatterer 101 is not arranged is shown by a dashed line as a comparative example. The pixel 700 can increase the quantity of the light which is incident on the photoelectric conversion regions 102 and 103, by arranging the scatterer 101 therein.

In the present exemplary embodiment, the scatterer 101 is formed so that the shape of the cross section in the xz plane becomes a trapezoid shape, but may also have a quadrangle shape or a triangle shape, as long as the scatterer 101 scatters a part of the light flux which is incident from the outside, and has the refractive index lower than that of a material of the pupil dividing portion 110. It is desirable to set the surface area of the upper surface (surface at +z side) of the scatterer 101 so as to be smaller than the surface area of the lower surface (surface at −z side) thereof. Thereby, the scatterer 101 can increase the forward scattering therefrom compared to the back scattering therefrom, and can increase the quantity of the lights which are incident on the photoelectric conversion region 102 and the photoelectric conversion region 103. In addition, the scatterer 101 may have a composition of dispersing fine particles or voids in a medium. The scatterer 101 can enhance the light scattering properties by dispersing the fine particles or the voids in the medium. In addition, the widths of the scatterer 101 may be shorter or longer than the length shown in the present exemplary embodiment, similarly to those of Exemplary Embodiment 1.

Figure 9:
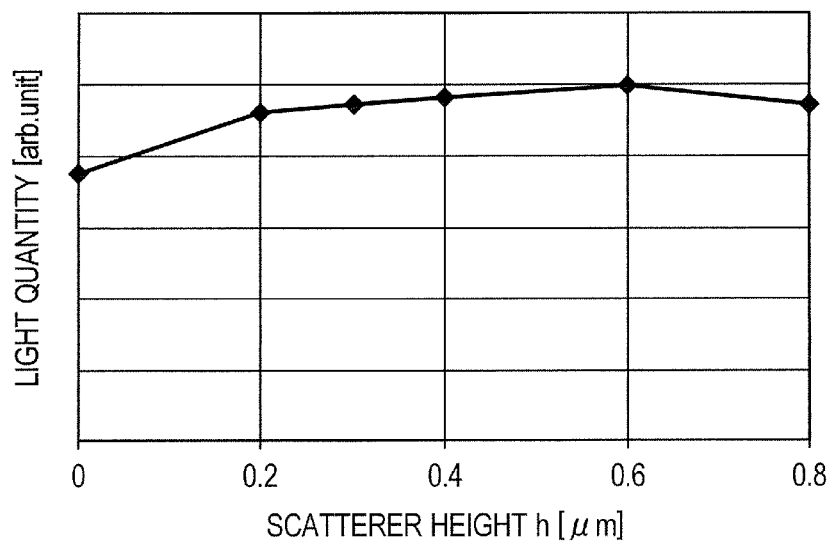
FIG. 9 is a view for describing the dependency of the sensitivity of the pixel for measuring the distance in Exemplary Embodiment 2 of the present invention, on the height of the scatterer.
Figure 12B:
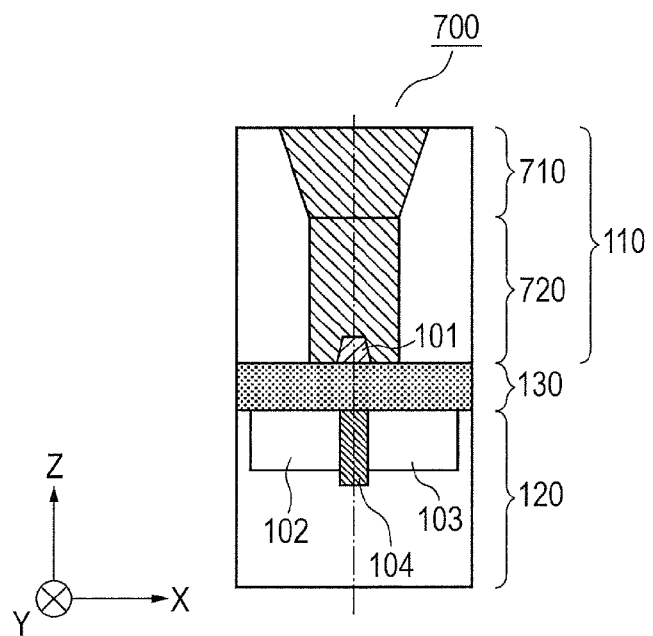

In the present exemplary embodiment, the height h of the scatterer 101 has been set at 0.4 µm, but may be higher or lower than 0.4 µm. FIG. 9 is a graph showing the sum of the quantities (quantity of light to be received by pixel 100) of respective lights which are received by the photoelectric conversion regions 102 and 103, when light in an angle range from −15° to +15° of the pixel 100 is incident from the outside. The horizontal axis represents the height h of the scatterer 101, and the vertical axis represents the quantity of the light to be received by the pixel 100. As the height h of the scatterer 101 increases, the quantity of the light increases. However, if the height of the scatterer 101 becomes higher than the height h=0.6 µm, the quantity of the light gradually decreases. As the height of the scatterer 101 is higher, the difficulty in manufacture becomes higher. Accordingly, the height of the scatterer 101 is desirably set at 0.6 µm or less in consideration of the difficulty in the manufacture. Incidentally, the pixel 700 of the present exemplary embodiment includes the pupil dividing portion 110 and the light receiving portion 120, but as is illustrated in FIGS. 12A and 12B, an interlayer 130 may be arranged between the light receiving portion 120 and the pupil dividing portion 110. In FIGS. 12A and 12B, the scatterer 101 is positioned on the interlayer 130. Even when the interlayer 130 is arranged therebetween, the pupil dividing portion 110 can optically scatter the light flux which is incident from the outside and heads to the element isolation region 104 by the scatterer 101, and can distribute the light to the photoelectric conversion regions 102 and 103. As a result, the interlayer 130 can enhance the pixel sensitivity of the pixel 400. The interlayer 130 may also be formed so as to function as an anti-reflection film in a region of wavelengths with which the solid-state imaging device provided with the pixel 400 takes an image, by being formed from a plurality of films. When functioning as the anti-reflection film, the interlayer 130 can more efficiently guide the light flux which is incident from the outside to the light receiving portion 120, and can enhance the pixel sensitivity of the pixel 700. In addition, the interlayer 130 may also have a function of a protection film for protecting the light receiving portion 120 in a semiconductor process such as etching, or a function of a gettering film for lowering the concentration of metal impurities in the light receiving portion 120, by appropriately selecting a material of the interlayer 130.

Exemplary Embodiment 3

Figure 10:
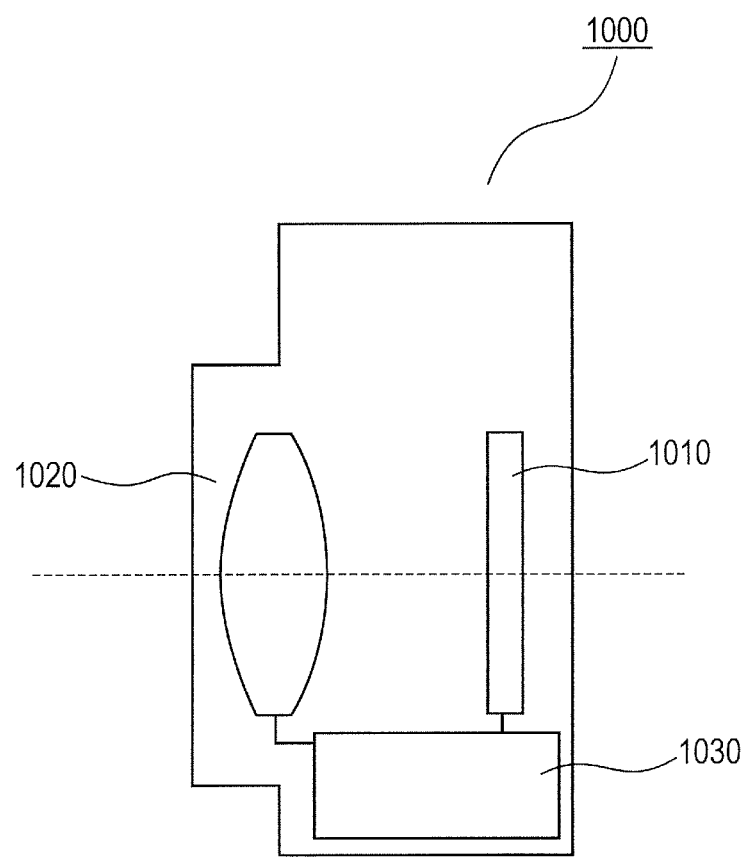
FIG. 10 is a view for describing an imaging apparatus provided with a solid-state imaging device, in Exemplary Embodiment 3 of the present invention.

As Exemplary Embodiment 3, an imaging apparatus such as a camera provided with the solid-state imaging device of the present invention will be described below with reference to FIG. 10. An imaging apparatus 1000 is provided with the solid-state imaging device 1010 of the present invention. An imaging lens 1020 of the imaging apparatus and a processing portion 1030 are shown. At least a part of pixels in the solid-state imaging device 1010 is provided with a distance measuring pixel. The pixel 400 described in Exemplary Embodiment 1 or the pixel 700 described in Exemplary Embodiment 2 can be used for the distance measuring pixel. The processing portion 1030 includes an arithmetic operation unit which calculates a distance from an object to be imaged based on a pixel signal sent from the solid-state imaging device 1010, and an image generation unit which generates an image of the object to be imaged. The imaging lens 1020 is provided with a drive portion for driving an imaging lens 1030 based on the information of the distance from the object to be imaged which has been calculated in the processing portion 1030. The imaging apparatus of the present exemplary embodiment drives the imaging lens 1020 based on the calculated distance from the object to be imaged, and accordingly can focus on the object with a high speed and high accuracy. In addition, the distance measuring pixel in the solid-state imaging device 1010 can suppress the degradation of the sensitivity, which is caused by the element isolation region, and accordingly the imaging apparatus can generate an image of high quality.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-282110, filed Dec. 22, 2011 which is hereby incorporated by reference herein in its entirety.

The invention claimed is:

1. A solid-state imaging device comprising a plurality of pixels, wherein
at least one of the plurality of pixels has a pupil dividing portion and a plurality of photoelectric conversion regions, and wherein:
a scatterer is provided within the pupil dividing portion and adjacent to a region between two adjacent ones of the plurality of photoelectric conversion regions,
a refractive index of the scatterer is smaller than that of the pupil dividing portion peripheral to the scatterer,
the pupil dividing portion has a micro lens, and
the plurality of photoelectric conversion regions receive respective lights through the micro lens.

2. The solid-state imaging device according to claim 1, wherein the scatterer is arranged at a position contacting a surface of the pupil dividing portion at a side of the plurality of photoelectric conversion regions.

3. The solid-state imaging device according to claim 1, wherein the scatterer has, at a light incident side, an end portion beyond a paraxial imaging plane of the micro lens toward the light incident side.

4. The solid-state imaging device according to claim 1, wherein the scatterer has a height of 1.0 µm or smaller.

5. The solid-state imaging device according to claim 4, wherein the scatterer has a height of 0.6 µm or smaller.

6. The solid-state imaging device according to claim 1, wherein the pupil dividing portion has a waveguide configured to guide an incident light onto the plurality of photoelectric conversion regions including a core and a cladding, and a refractive index of the core is larger than the refractive index of the scatterer, and larger than a refractive index of the cladding.

7. The solid-state imaging device according to claim 1, wherein an area of a surface of the scatterer at a side of the plurality of photoelectric conversion regions is larger than an area of a surface of the scatterer at a light incident side.

8. The solid-state imaging device according to claim 1, wherein an interlayer is arranged between the plurality of photoelectric conversion regions and the pupil dividing portion.

9. The solid-state imaging device according to claim 8, wherein the interlayer operates as an anti-reflection layer suppressing a reflection of light in at least a part of a wavelength region of a light for use in imaging by the solid-state imaging device.

10. An imaging apparatus comprising:
a solid-state imaging device according to claim 1; and
an imaging lens configured to guide an external light into the solid-state imaging device.

11. The imaging apparatus according to claim 10 further comprising an arithmetic operation unit configured to calculate a distance from an object to be imaged.

12. The solid-state imaging device according to claim 1, wherein the scatterer is provided on an optical axis of the micro lens.

13. The solid-state imaging device according to claim 12, wherein the region between adjacent two of the plurality of photoelectric conversion regions is provided on an optical axis of the micro lens.

14. A solid-state imaging device comprising a plurality of pixels, wherein
at least one of the plurality of pixels has a pupil dividing portion and a plurality of photoelectric conversion regions, and wherein:
a scatterer and a high refractive index portion are provided within the pupil dividing portion,
the scatterer is adjacent to a region between two adjacent ones of the plurality of photoelectric conversion regions,
the high refractive index portion is adjacent to the adjacent two of the plurality of photoelectric conversion regions,
a refractive index of the scatterer is smaller than that of the high refractive index portion,
the pupil dividing portion has a micro lens, and
the plurality of photoelectric conversion regions receive respective lights through the micro lens.

15. The solid-state imaging device according to claim 14, wherein the scatterer has a height of 1.0 μm or smaller.

16. The solid-state imaging device according to claim 14, wherein the scatterer has a height of 0.6 μm or smaller.

17. The solid-state imaging device according to claim 14, wherein an area of a surface of the scatterer at a side of the plurality of photoelectric conversion regions is larger than an area of a surface of the scatterer at a light incident side.

18. An imaging apparatus comprising:
a solid-state imaging device according to claim 14; and
an imaging lens configured to guide an external light into the solid-state imaging device.

19. The imaging apparatus according to claim 18 further comprising an arithmetic operation unit configured to calculate a distance from an object to be imaged.

20. The imaging apparatus according to claim 18, wherein the plurality of photoelectric conversion regions receive though the micro lens respectively the lights from the different regions of a pupil of the imaging lens.

21. A solid-state imaging device comprising a plurality of pixels, wherein
at least one of the plurality of pixels includes:
a micro lens;
a first photoelectric conversion region configured to receive a part of light from the micro lens;
a second photoelectric conversion region configured to receive another part of the light from the micro lens, and
a scatterer provided between the micro lens and a region between the first photoelectric conversion region and the second photoelectric conversion region, and
wherein a refractive index of the scatterer is smaller than that of a material peripheral to the scatterer.

22. The solid-state imaging device according to claim 21, wherein the scatterer is provided on an optical axis of the micro lens.

23. The solid-state imaging device according to claim 22, wherein the region between two adjacent ones of the plurality of photoelectric conversion regions is provided on an optical axis of the micro lens.

* * * * *